(12) United States Patent
Kuo et al.

(10) Patent No.: US 7,531,887 B2
(45) Date of Patent: May 12, 2009

(54) MINIATURE INDUCTOR SUITABLE FOR INTEGRATED CIRCUITS

(75) Inventors: Chien-Nan Kuo, Pingtung (TW); Chien-Chia Ma, Ciaotou Township (TW)

(73) Assignee: National Chiao Tung University, Hsinchu (TW)

( * ) Notice: Subject to any disclaimer, the term of this patent is extended or adjusted under 35 U.S.C. 154(b) by 465 days.

(21) Appl. No.: 11/226,989

(22) Filed: Sep. 15, 2005

(65) Prior Publication Data

US 2006/0226511 A1    Oct. 12, 2006

(30) Foreign Application Priority Data

Apr. 11, 2005   (TW) .............................. 94111338 A

(51) Int. Cl.
*H01L 29/82* (2006.01)
(52) U.S. Cl. ............................... 257/531; 257/E21.022
(58) Field of Classification Search ................ 257/531, 257/E21.022, 532; 336/211, 232
See application file for complete search history.

(56) References Cited

U.S. PATENT DOCUMENTS 6,635,949 B2 * 10/2003 Lowther et al. ............. 257/531
6,714,113 B1    3/2004 Abadeer et al.
2003/0090339 A1 * 5/2003 Yu et al. ..................... 333/167

OTHER PUBLICATIONS

J.N. Burghartz, et al., "Microwave Inductors and Capacitors in Standard Multilevel Interconnect Silicon Technology," IEEE Transactions on Microwave Theory and Techniques, vol. 44, No. 1 (Jan. 1996), pp. 100-104.
C.C. Tang, et al., "Miniature 3-D Inductors in Standard CMOS Process," IEEE Journal of Solid-State Circuits, vol. 37, No. 4 (Apr. 2002), pp. 471-480.
M. Danesh and J.R. Long, "Differentially Driven Symmetric Microstrip Inductors," IEEE Transactions on Microwave Theory and Techniques, vol. 50, No. 1 (Jan. 2002), pp. 332-341.

* cited by examiner

*Primary Examiner*—Jerome Jackson, Jr.
*Assistant Examiner*—Paul A Budd
(74) *Attorney, Agent, or Firm*—Bucknam and Archer

(57) ABSTRACT

A miniature inductor suitable for integrated circuits comprises a semiconductor substrate having a coplanar strip line and a plurality of metal-insulator-metal (MIM) capacitors, wherein the plurality of MIM capacitors are connected between the transmission lines of the coplanar strip line in parallel, and the coplanar strip line connected with the MIM capacitors further comprises a crossed planar strip line structure or a shifted planar strip line structure. The present invention reduces the occupied area for an inductor by adding the MIM capacitors and folding the transmission lines, and alleviates the quality factor degradation of the inductor caused by substrate loss.

6 Claims, 3 Drawing Sheets

MINIATURE INDUCTOR SUITABLE FOR INTEGRATED CIRCUITS

BACKGROUND OF THE INVENTION

1. Field of the Invention

The present invention relates to a miniature inductor suitable for integrated circuits, and in particular to a miniature inductor having a folded coplanar strip line.

2. Description of the Related Art

In the prior art, a miniature inductor for integrated circuits occupies a quite large area, and is easily affected by material loss, and has low quality factor and low self-resonant frequency.

Currently, there are various ways to manufacture an inductor in general integrated circuit manufacturing process technology. For example, U.S. Pat. No. 6,714,113, entitled "Inductor for Integrated Circuits", filed in April, 2004 by W. Abadeer et al., and Paper "Microwave Inductors and Capacitors in Standard Multilevel Interconnect Silicon Technology," IEEEMTT, January 1996, submitted by J. N. Burghartz et al. all use a microstrip line structure, which is planar. Although it adopts a spiral line shape or a folded line shape, the disadvantage is that it takes up a larger area. Moreover, in integrated circuit silicon manufacturing process, an inductor is easily affected by substrate loss, and it is difficult to enhance quality factor.

Furthermore, in accordance with paper "Miniature 3D Inductors in Standard CMOS Process" submitted in April, 2002 by C.-C. Tang et al., an inductor is designed into a 3D type by using a multilevel metal interconnection structure, such that its occupied area can be reduced. The disadvantage is that the multilevel structure causes a larger parasitic capacitance, resulting in lower frequency bandwidth (it is difficult to be increased to more than 10 GHz). Moreover, in paper "Differentially Driven Symmetric Microstrip Inductors" submitted in January, 2002 by Danesh et al., it is discussed that if a microstrip line is used differentially, quality factor can be greatly increased. However, the disadvantage is that it cannot reduce the occupied area.

SUMMARY OF THE INVENTION

In the views of the above, an object of the present invention is to provide a miniature inductor suitable for integrated circuits. The miniature inductor can reduce the area occupied by the inductor and efficiently decreases costs for high-frequency integrated circuits. Meanwhile, it can alleviate the quality factor degradation caused by the inductor on substrate loss.

In order to achieve this object, the present invention provides a miniature inductor suitable for integrated circuits fabrication. The miniature inductor comprises: a semiconductor substrate having a coplanar strip line, a plurality of metal lines, a plurality of metal-insulator-metal (MIM) capacitors 1, wherein the plurality of metal lines are formed on a surface of the semiconductor substrate, and the plurality of MIM capacitors are connected between the transmission lines of the coplanar strip line in parallel.

According to a preferred embodiment of the present invention, the miniature inductor has two kinds of folded structures: one is a crossed planar strip line structure 6; and the other is a shifted planar strip line structure 8. The crossed planar strip line structure 6 has a shape in which the coplanar strip line is crossed and inverted at its central portion. The shifted planar strip line structure 8 has a shape in which a portion of the coplanar strip line is shifted and inverted.

The present invention further provides a method for manufacturing a miniature inductor suitable for integrated circuits. The method comprises the following steps: providing a semiconductor substrate; forming a coplanar strip line on the semiconductor substrate; connecting a plurality of MIM capacitors 1 between the transmission lines of the coplanar strip line; crossing the coplanar strip line at its central portion; and inverting the crossed coplanar strip line.

The present invention additionally provides a method for manufacturing a miniature inductor suitable for integrated circuits. The method comprises the following steps: providing a semiconductor substrate; forming a coplanar strip line on the semiconductor substrate; connecting a plurality of MIM capacitors 1 between the transmission lines of the coplanar strip line; shifting a portion of the coplanar strip line; and inverting the shifted coplanar strip line.

In summary, the present invention applies transmission line theory to add MIM capacitors 1 into a terminal short-circuited coplanar strip line 3 so as to increase slow-wave factor. With the addition of crossing or shifting plus inverting methods, the area occupied by the manufactured miniature inductor can be reduced. Since the design architecture of the present invention employs a planar architecture, it has a smaller parasitic capacitance and is suitable for high-frequency bandwidth.

The above and other objectives, features and advantages of the present invention will become more clearly understood from the detailed descriptions given hereinafter and the accompanying drawings.

DESCRIPTION OF THE PREFERRED EMBODIMENTS

Figure 1:
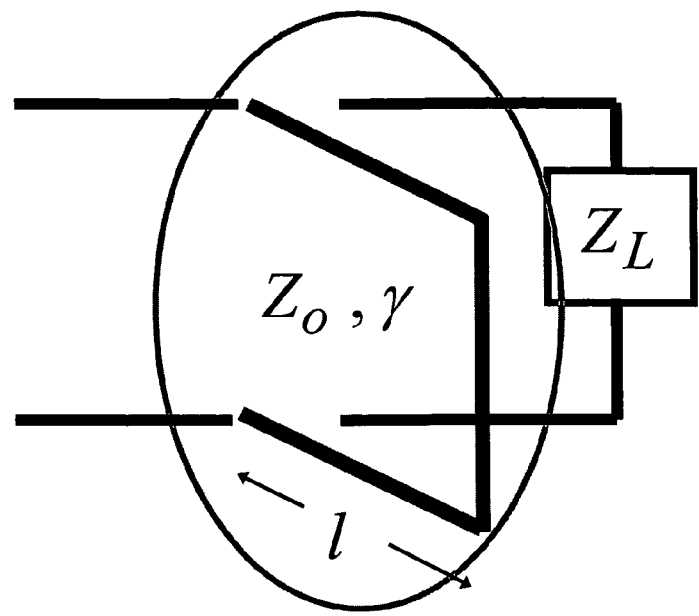
FIG. 1 is a drawing showing a single-stub impedance matching method.

FIG. 1 is a drawing showing a single-stub impedance matching method. As shown FIG. 1, when the terminal of a transmission line is short-circuited, it can be used as an inductive component. Its input impedance can be expressed as Equation (1). After expanding and arranging Equation (1), the real and imaginary parts of the input impedance can be obtained, and Equation (2) can be further derived.

$$Z_{in} = Z_o \cdot \tanh(\gamma l) = (R + jX) \cdot \tanh((\alpha + \beta j)l) \quad \text{Equation (1)}$$

$$Q = \frac{\frac{\sin 2\beta l}{\sinh 2\alpha l} + \frac{X}{R}}{1 - \frac{X}{R}\frac{\sin 2\beta l}{\sinh 2\alpha l}} \quad \text{Equation (2)}$$

As shown on the following Equation (3), under a specific characteristic impedance R, if it is intended to reduce the length of the transmission line, a larger β value must be used. Furthermore, we lean from Equation (4) that our goal can be achieved by increasing inductance or capacitance value per unit length $$L_{eff} = R \tan(\beta l)/\omega \quad \text{Equation (3)}$$

$$\beta = \omega \sqrt{LC} \quad \text{Equation (4)}$$

Figure 2:
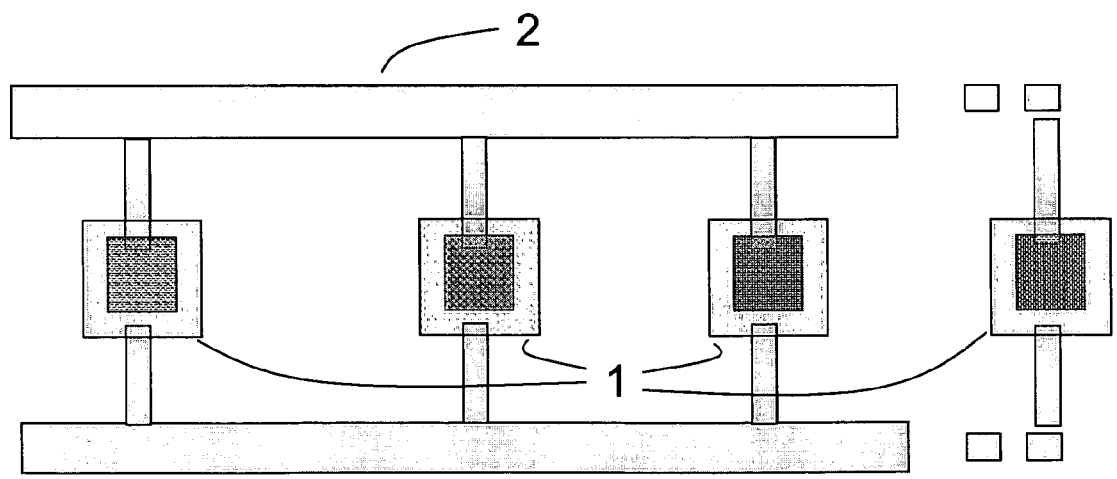
FIG. 2 is a drawing showing a coplanar strip line (CPS) added with MIM capacitors according to a preferred embodiment.

FIG. 2 is a drawing showing a coplanar strip line (CPS) added with MIM capacitors 1 according to a preferred embodiment. Please referring to FIG. 2, the used length can be efficiently reduced by increasing the β value according to the concept of high slow-wave factor CPS (HS-CPS) 2. That is, the area becomes smaller. However, since the characteristic impedance is also reduced, the effect of reduced length depends on the rising rate of the tangent function. When a larger β value is used, since the rising rate of the function is faster, a shorter length can be adopted. As to the Q value of the inductor, we can see from Equation (2) that the smaller the α value of the inductor is, the Q value will become much better. Energy loss is mainly caused by substrate loss and conductor loss. Besides the self differential excitation characteristic of the CPS makes the substrate loss reduced, the MIM capacitors 1 located between the transmission lines of the CPS can further concentrate electric field, and thus reduce the coupling in the silicon substrate, which will lower the loss to the lowest level. For the problem of metal loss, it can be resolved by connecting two layers of metal lines in parallel in manufacturing process.

Figure 3:
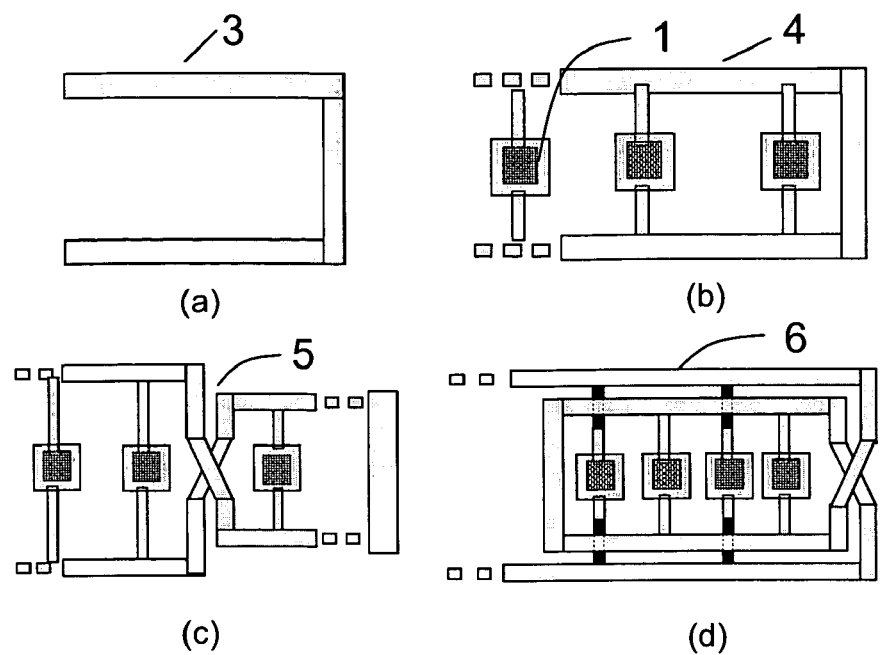
FIGS. 3a~3d are drawings showing a tape-out inductor structure according to a preferred embodiment of the present invention.

Since the length of the designed CPS can reach up to several hundreds μm, the present invention makes the CPS folded. According to the present invention, there are two kinds of folded structures. The first kind is a crossed planar strip line structure 6, as shown in the drawing of FIGS. 3a~3d illustrating a tape-out inductor structure according to a preferred embodiment of the present invention. First, FIG. 3a depicts a structural view of a terminal short-circuited coplanar strip line 3. Next, a plurality of MIM capacitors 1 are connected between the transmission lines of the coplanar strip line in parallel to form a terminal short-circuited high slow-wave factor CPS 4, shown in FIG. 3b. Then, the coplanar strip line connected with the plurality of MIM capacitors 1 is crossed at its central portion. That is a crossed high slow-wave factor CPS 5, shown in FIG. 3c. Finally, as illustrated in FIG. 3d, crossed high slow-wave factor CPS 5 is inverted.

Figure 4:
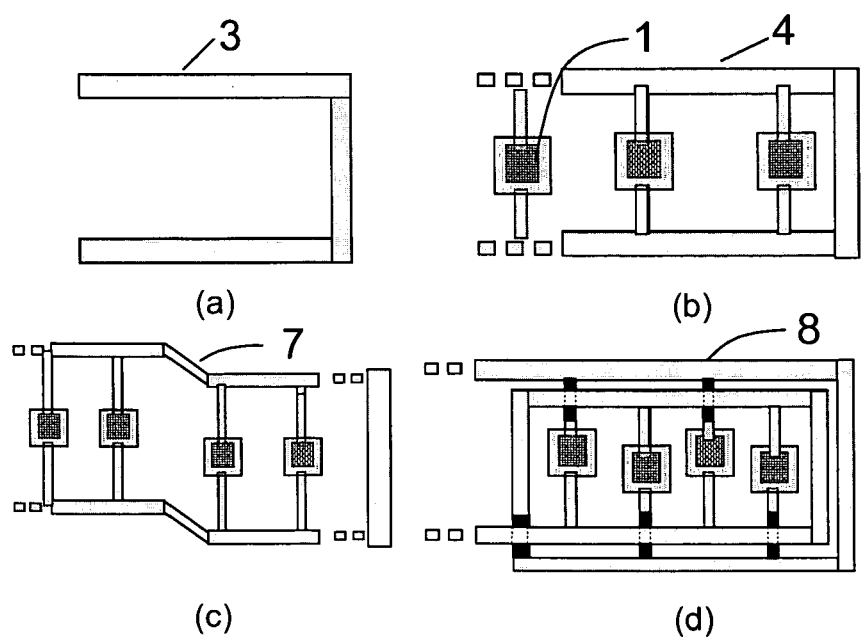
FIGS. 4a~4d are drawings showing a tape-out inductor structure according to a preferred embodiment of the present invention.

In another preferred embodiment of the present invention, the other kind of folded structure is adopted, that is, a shifted planar strip line structure 8. As shown in FIGS. 4a~4d, the difference to the above-stated embodiment is that a portion of coplanar strip lines connected with the plurality of MIM capacitors 1 are shifted. That is a shifted high slow-wave factor CPS 7, shown in FIG. 4c. Subsequently, as depicted in FIG. 4d, the shifted high slow-wave factor CPS 7 are inverted.

The above-stated two kinds of folding methods not only reduce half occupied area due to folding, but also increase inductance value per unit length due to the mutual inductance between the two transmission lines. As a result, the β value and characteristic impedance are increased as well. This will facilitate the reduction of the total length of the CPS.

In a preferred embodiment of the present invention, it is to enable a 1nH inductor operating at about 10 GHz, and the total length of the inductor is less than 200 μm. Herein, taking a 1nH inductor as an example, first, in step a, when let β1=40°, l=400 μm, the required β and characteristic impedance R are 1.8 (rad/mm) and 75 ohm, respectively. Next, in step b, it can be derived by electromagnetic simulation software and hand calculation analysis that: when the MIM capacitors each having 16fF per unit are spaced 64 μm apart, the required β can be substantially obtained. Finally, in step c, the pitch and width of the metal lines are adjusted to make the characteristic impedance meet with the design requirement and have a 1nH inductance at 10 GHz.

Figure 5:
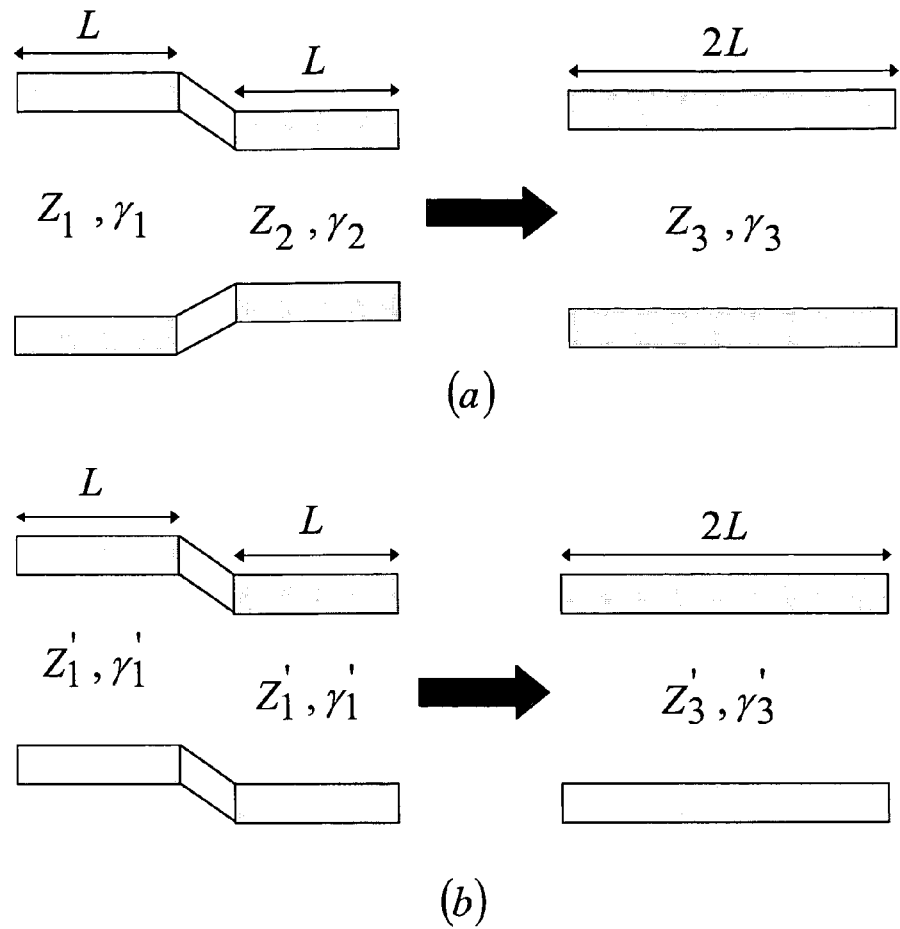
FIG. 5a is a drawing showing an equivalent model of a crossed and inverted CPS according to a preferred embodiment of the present invention.
FIG. 5b is a drawing showing an equivalent model of a shifted and inverted CPS according to a preferred embodiment of the present invention.

FIG. 5a is a drawing showing an equivalent model of a crossed and inverted CPS according to a preferred embodiment of the present invention. Please referring to FIG. 5a, it is noted that there are two transmission lines per unit length to pass due to folded CPS. When taking the first folding method (that is, the crossed planar strip line structure 6) into consideration, we see that two transmission lines having different characteristic impedance $Z_1$ and $Z_2$ and the same lengths L are connected to each other. Finally, the two transmission lines are equivalent to one transmission line having a characteristic impedance $Z_3$ and a length 2L. The equivalent Z3 and γ3 can be obtained by using electromagnetic simulation software in order to design the inductor with the above-stated equations.

FIG. 5b is a drawing showing an equivalent model of a shifted and inverted CPS according to a preferred embodiment of the present invention. Referring to FIG. 5b, when taking the second folding method (that is, the shifted planar strip line structure 8) into consideration, since two transmission lines have the same characteristic impedance $Z_1'$, they can be equivalent to a transmission line having a characteristic impedance $Z_3'$ and a length 2L.

Figure 6:
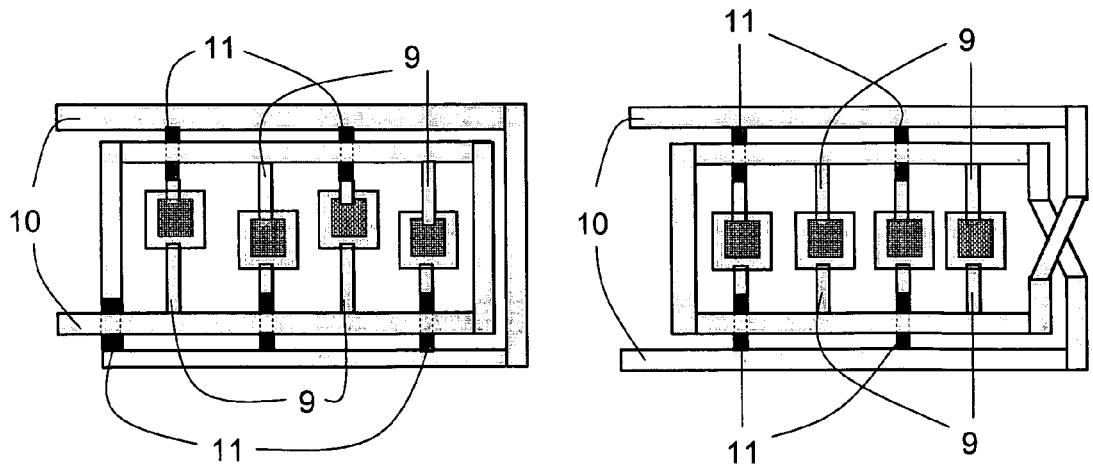
FIGS. 6a and 6b are drawings showing two kinds of folding structures according to a preferred embodiment of the present invention.

Two kinds of structures according to a preferred embodiment of the present invention are shown in FIGS. 6a and 6b. MIM capacitors 1 are connected to two peripheral metal lines 10 via sixth metal line 9. If MIM capacitors 1 need to be connected to the outmost metal lines of these peripheral metal lines 10, it is necessary to use fourth metal line 11 in order to cross-connect with the sixth metal lines 9 and fifth metal lines 10.

In a preferred embodiment of the present invention, an efficiency comparison between the two kinds of structures is made. The same specifications are set as 8 μm in metal line width, 2 μm in metal line pitch and simulation starting in a case that M6 and M5 are connected in parallel.

First kind of structure Symmetric (differential excitation): no capacitors are added, that is, the regular symmetric inductor; and second kind of structure MiM_S64 μm: MIM capacitors 1 are added inside an inductor and spaced 64 μm apart.

The result shows that under the same inductance value, as compared to the first structural inductor having no MIM capacitors added, the second structural inductor can reduce about more 15% in area. Furthermore, Qmax occurring at around 10 GHz means that Qmax can also be adjusted by using this structure so as to make the inductor more efficient.

Although the invention has been disclosed in terms of preferred embodiments, the disclosure is not intended to limit the invention. Those skilled in the art can make changes and modifications still within the scope and spirit of the invention which will be defined by the claims below.

LIST OF MAJOR ELEMENTS AND THEIR CORRESPONDING REFERENCE NUMERALS 1 metal-insulator-metal (MIM) capacitors
2 high slow-wave factor CPS
3 terminal short-circuited coplanar strip line
4 terminal short-circuited high slow-wave factor CPS
5 crossed high slow-wave factor CPS
6 crossed planar strip line structure
7 shifted high slow-wave factor CPS
8 shifted planar strip line structure
9 sixth metal line
10 fifth metal lines
11 fourth metal line
L Length
2L Length
$Z_1$ characteristic impedance
$Z_1'$ characteristic impedance
$Z_2$ characteristic impedance
$Z_3$ characteristic impedance
$Z_3'$ characteristic impedance

What is claimed is:

1. A miniature inductor suitable for integrated circuits formed on a semiconductor substrate, comprising:
   two transmission lines configured by a coplanar strip line which is short-circuited; and
   a plurality of metal-insulator-metal (MIM) capacitors being connected between the strip line of each transmission line in parallel,
   wherein the coplanar strip line is configured in such a way that the coplanar strip line is twisted at a middle portion of the coplanar strip line forming a cross point, and a second portion, of which the transmission lines are short-circuited, of the coplanar strip line at one side of the cross point is turned over and alternated on a first portion of the coplanar strip line at the other side of the cross point.

2. The miniature inductor as claimed in claim 1, wherein a substrate loss can be reduced by means of a self differential excitation characteristic of the coplanar strip lines.

3. The miniature inductor as claimed in claim 2, wherein the miniature inductor can be manufactured by an integrated circuit silicon process.

4. A miniature inductor suitable for integrated circuits formed on a semiconductor substrate, comprising:
   two transmission lines configured by a coplanar strip line which is short-circuited; and
   a plurality of metal-insulator-metal (MIM) capacitors being connected between the strip line of each transmission line in parallel,
   wherein the coplanar strip line is configured in such a way that the coplanar strip line is divided into a first portion having a first terminal and a second terminal and a second portion having a third terminal corresponding to the first terminal and a fourth terminal corresponding to the second terminal, and the second portion of which the transmission lines are short-circuited is downwardly shifted and is turned over and alternated on the first portion so as to connect the first terminal and the second terminal with the third terminal and the fourth terminal, respectively.

5. The miniature inductor as claimed in claim 4, wherein a substrate loss can be reduced by means of a self differential excitation characteristic of the coplanar strip lines.

6. The miniature inductor as claimed in claim 5, wherein the miniature inductor can be manufactured by an integrated circuit silicon process.

* * * * *